(12) United States Patent
Grziwok et al.

(10) Patent No.: US 10,176,651 B2
(45) Date of Patent: Jan. 8, 2019

(54) MOTORIZED DOCKING APPARATUS

(71) Applicant: Lilitab LLC, San Rafael, CA (US)

(72) Inventors: Bryan Rudolf Grziwok, Berkeley, CA (US); Adam Scott Aronson, San Rafael, CA (US)

(73) Assignee: Lilitab LLC, San Rafael, CA (US)

( * ) Notice: Subject to any disclaimer, the term of this patent is extended or adjusted under 35 U.S.C. 154(b) by 215 days.

(21) Appl. No.: 15/011,146

(22) Filed: Jan. 29, 2016

(65) Prior Publication Data

US 2016/0225204 A1   Aug. 4, 2016

Related U.S. Application Data

(60) Provisional application No. 62/110,385, filed on Jan. 30, 2015.

(51) Int. Cl.
| | |
|---|---|
| *G06F 21/00* | (2013.01) |
| *G07C 9/00* | (2006.01) |
| *E05B 73/00* | (2006.01) |
| *F16M 11/04* | (2006.01) |
| *F16M 11/14* | (2006.01) |
| *F16M 13/02* | (2006.01) |
| *H05K 5/02* | (2006.01) |
| *F16M 11/18* | (2006.01) |
| *F16M 13/00* | (2006.01) |
| *E05B 47/00* | (2006.01) |

(52) U.S. Cl.
CPC ...... *G07C 9/00031* (2013.01); *E05B 73/0082* (2013.01); *F16M 11/041* (2013.01); *F16M 11/14* (2013.01); *F16M 11/18* (2013.01); *F16M 13/00* (2013.01); *F16M 13/02* (2013.01); *H05K 5/0234* (2013.01); *H05K 5/0247* (2013.01); *E05B 47/0012* (2013.01); *F16M 2200/02* (2013.01)

(58) Field of Classification Search
CPC ....................................................... G06F 21/88
USPC ........................................................... 726/35
See application file for complete search history.

(56) References Cited

U.S. PATENT DOCUMENTS

| | | | |
|---|---|---|---|
| 2014/0059828 A1 | 3/2014 | Reynolds | |
| 2014/0260443 A1 | 9/2014 | Grziwok | |
| 2014/0362517 A1* | 12/2014 | Moock | ............... E05B 73/0082 361/679.43 |
| 2014/0366164 A1* | 12/2014 | Hoefgen | ................. G06F 21/88 726/34 |

OTHER PUBLICATIONS

International Application No. PCT/US2016/015610, Notification of Transmittal of the International Search Report and the Written Opinion of the International Searching Authority, dated Apr. 26, 2016, 15 pages.

* cited by examiner

*Primary Examiner* — Longbit Chai
(74) *Attorney, Agent, or Firm* — Fish & Richardson P.C.

(57) ABSTRACT

A docking apparatus includes a mechanism which allows both manual and powered locking and unlocking of the apparatus. A locking unit is disposed on a housing and is configured to be rotated to either an open position, a closed position, or a neutral position with a key. A key pinion is configured to rotate and drive an engaged key ring in response to a rotation of the locking unit using the key. A motor pinion is configured to rotate and drive an engaged motor ring in response to a rotation of the motor, which is electronically controlled.

25 Claims, 10 Drawing Sheets

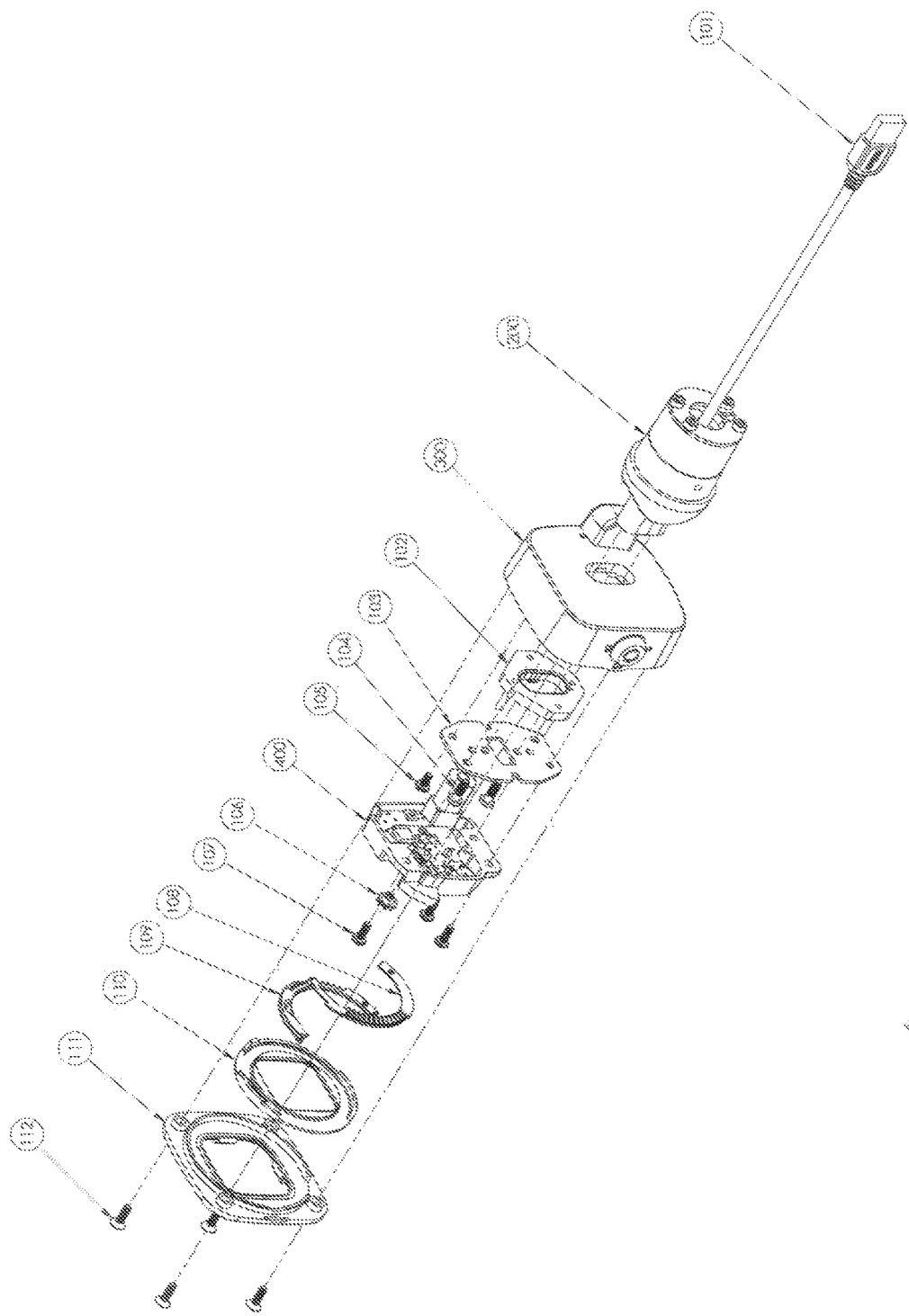

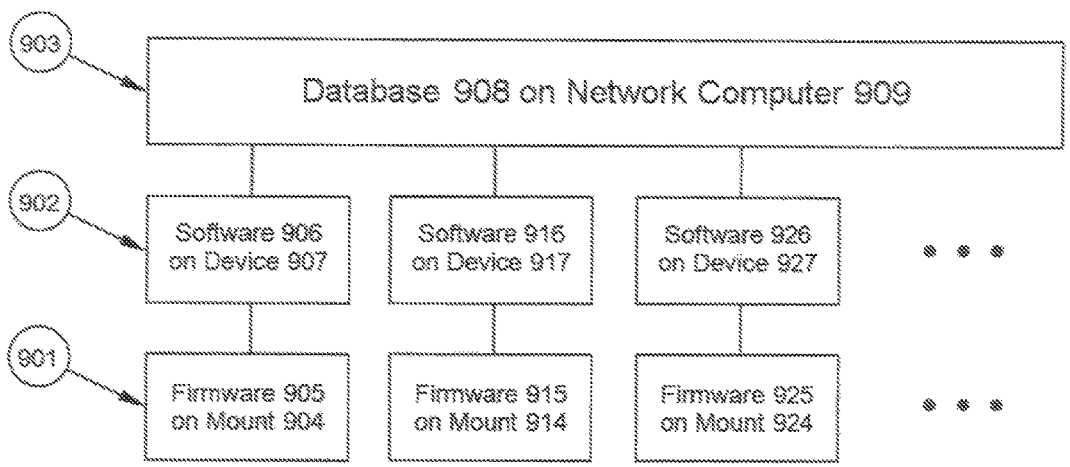
Figure 7 illustrates an example network topology for motorized locking mounts
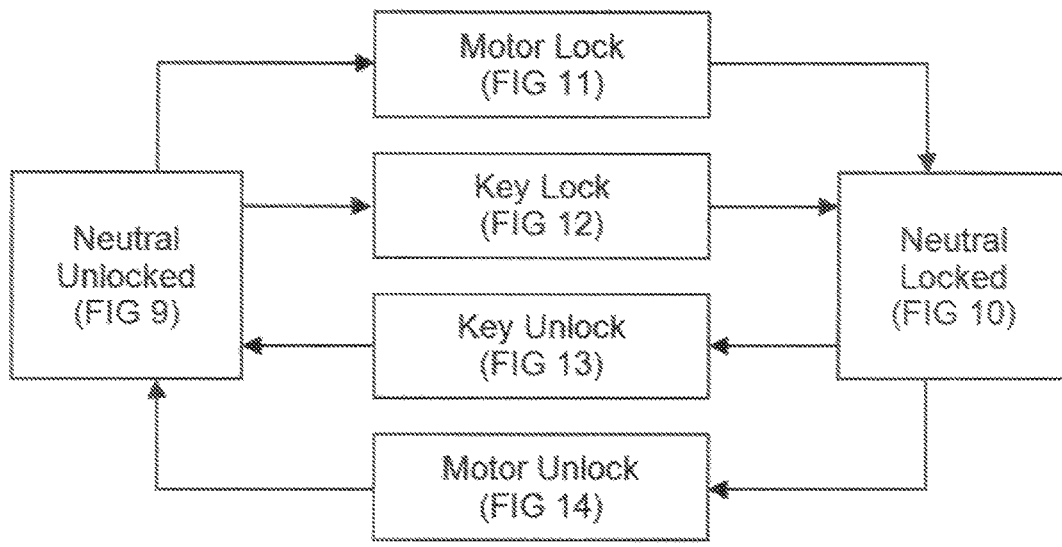
Figure 8 diagrams the locking and unlocking sequences of an example motorized locking mechanism

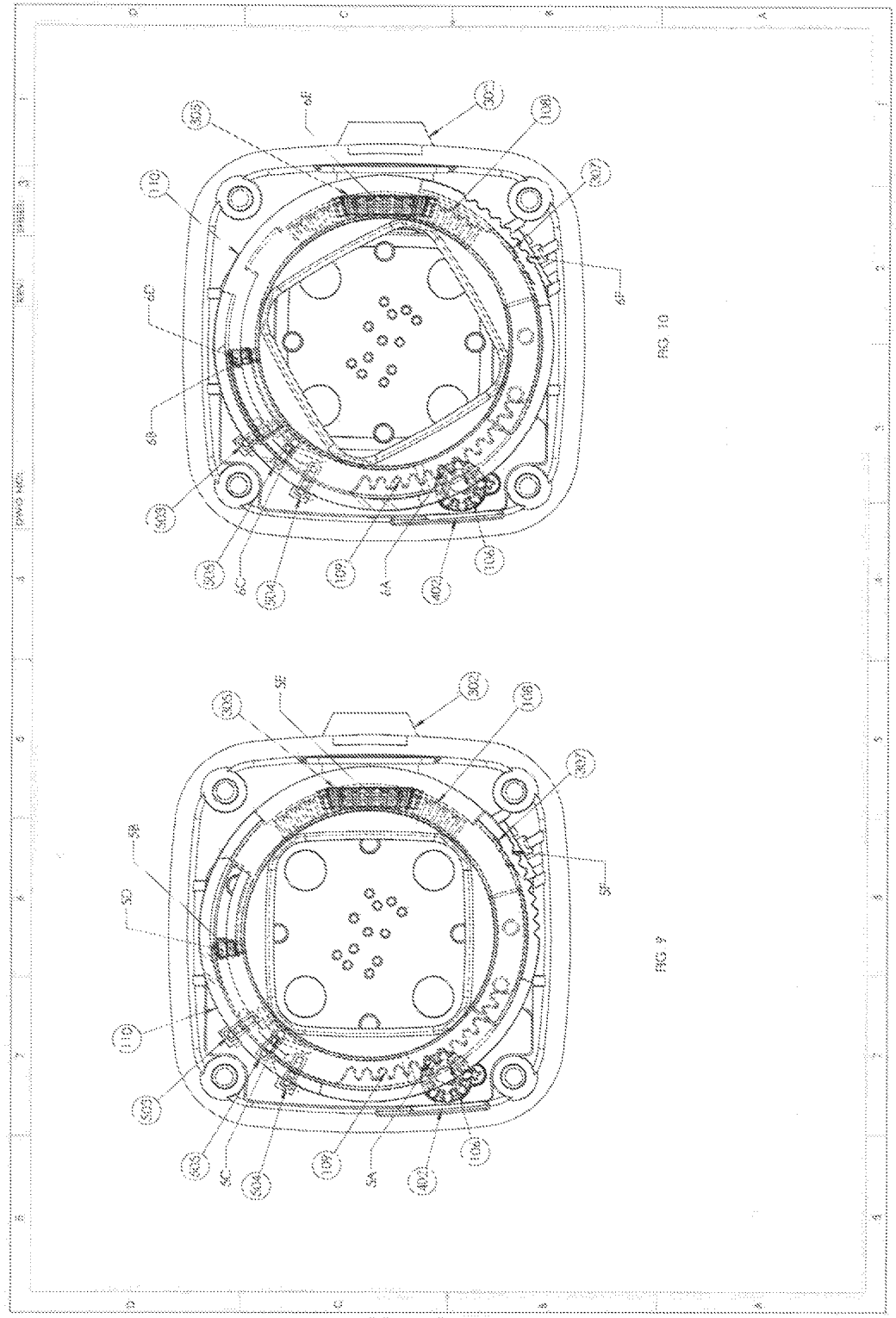

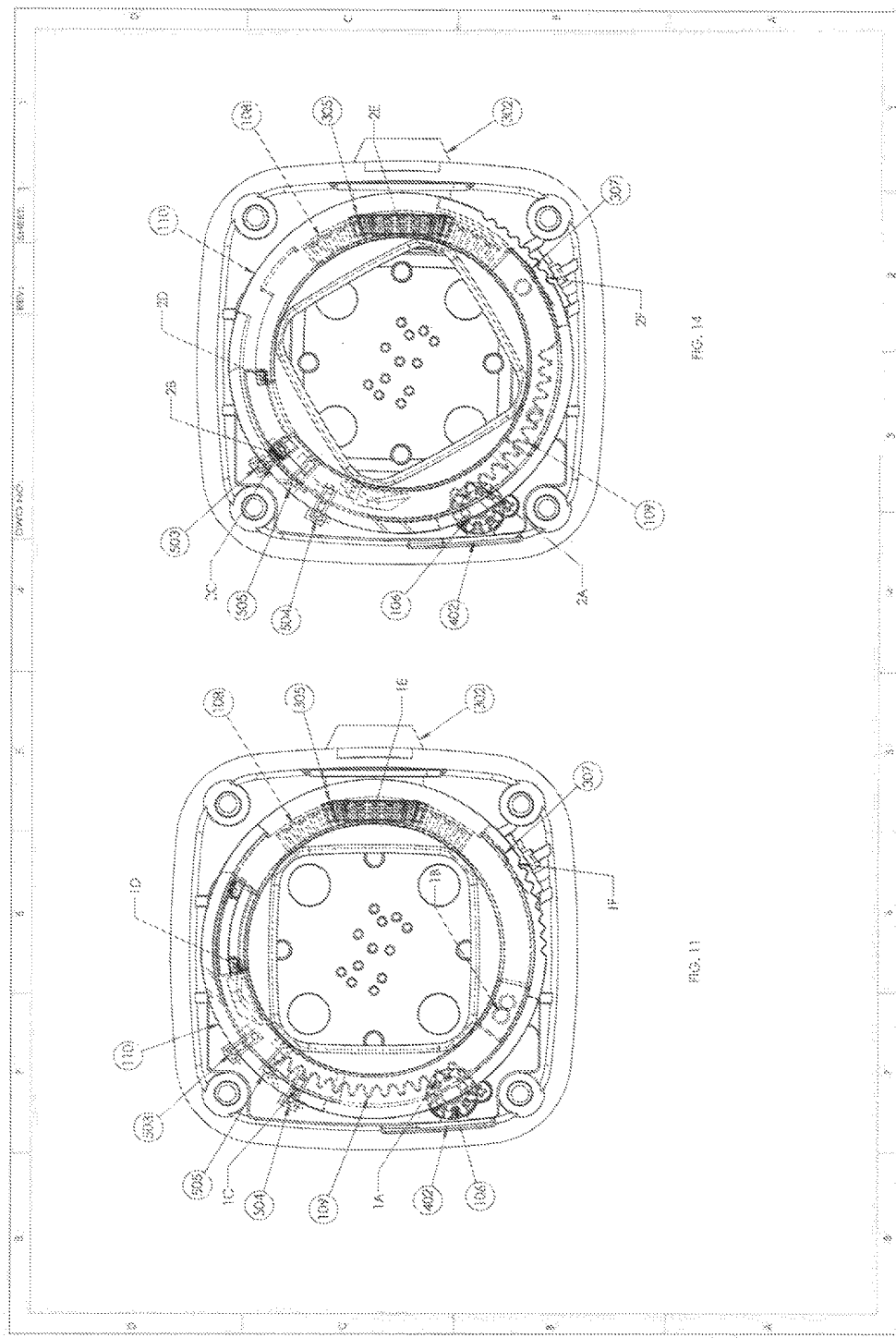

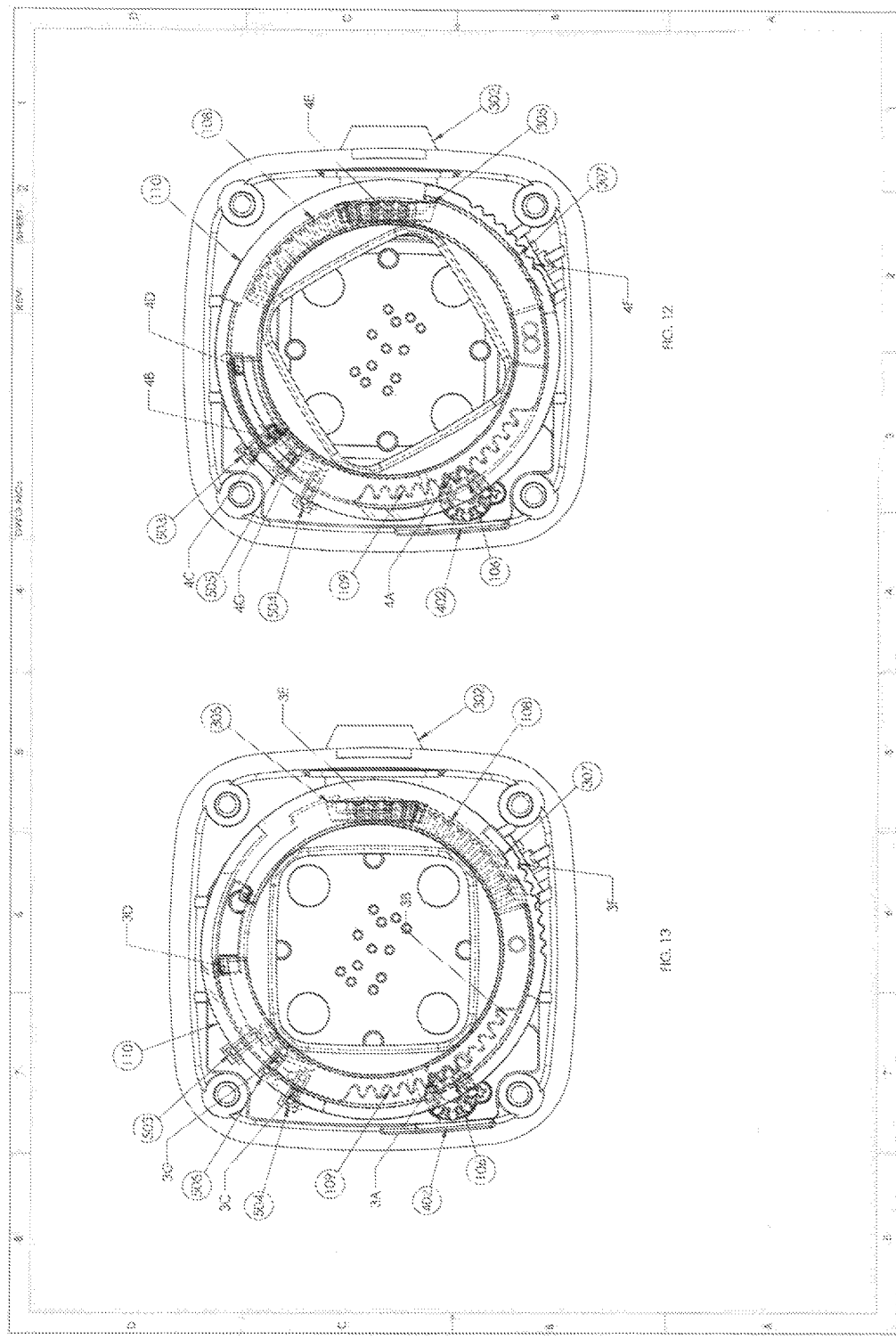

MOTORIZED DOCKING APPARATUS

CROSS-REFERENCE TO RELATED APPLICATIONS

This application claims priority to U.S. Application Ser. No. 62/110,385 filed on Jan. 30, 2015, the entire contents of which are incorporated herein by reference.

TECHNICAL FIELD

This disclosure relates to a motorized docking mechanism and apparatus, for example, for securing and supporting tablet computers and other types of electronic equipment.

BACKGROUND

To deter theft or vandalism, publicly displayed tablet computers or other electronic devices sometimes are encapsulated in a secure enclosure. The secure enclosure can be attached to a pedestal, a post or the like, and affixed to an immovable surface. To attach the secure enclosure to the pedestal or post, a docking mechanism may be used. Mains power can be required for publicly displayed electronic devices (sometimes called "kiosks") because onboard battery life can be insufficient for continuous use. Data connection with the tablet to outside devices can be desirable, to operate peripheral equipment, such as card readers, receipt printers, keyboards, and the like.

SUMMARY

This disclosure relates to a motorized docking mechanism and apparatus, for example, for a docking mount to secure and support tablet computers and electronic equipment. The docking apparatus described herein comprises a motor-driven rotating lock plate as part of a mechanical display mount with an electronic connection. Alternatively, or in combination, the lock plate can be actuated by the use of a key. When the docking apparatus is actuated by either the motor or manually by key, the mechanism can be designed so that either method of actuation does not interfere with the operation of the other.

Certain aspects encompass, a motorized mechanical mount including a housing having a front surface and a back surface. The back surface is separated from the front surface along a first axis. The mount includes a motor disposed on a second axis parallel to, and offset from, the first axis. The motor includes an output shaft which lies along the second axis, and to which a motor pinion is mounted. The pinion can be configured to cause a motor ring to rotate about the first axis. The motor ring can be configured to cause the locking plate to rotate to a locked or to an unlocked position, depending on the direction in which the motor is driven.

Certain aspects encompass, a key-lockable mechanical mount including a housing having a front surface and a back surface. The back surface is separated from the front surface along a first axis. The mount also includes a key lock disposed on a side surface that connects the front surface and back surface. The locking unit includes a lock mandrel disposed in the side surface, and the locking unit is configured to be either in an open position or a closed position. The mount also includes a key pinion mounted to the lock mandrel, and the key pinion is configured to be rotated about a second axis which is at an angle relative to the first axis. The key pinion is configured to rotate in response to a rotation of the locking unit using the key. The key pinion can be configured to cause a key ring to rotate about the first axis. The key ring can be configured to cause the locking plate to rotate to a locked or unlocked position, depending on the direction in which the key is turned.

Certain aspects encompass a motorized system for mounting a tablet computer. The system includes a housing comprising a first surface and a second surface separated from the first surface on the first axis. The housing is configured to be attached to the first end of the mounting post. The system includes a motor disposed on a second axis parallel to, and offset from, the first axis. The motor includes an output shaft which lies along the second axis, and to which a motor pinion is mounted. The pinion can be configured to cause a motor ring to rotate about the first axis. The motor ring can be configured to cause the locking plate to rotate in to a locked or unlocked position, depending on the direction in which the motor is driven. The system may also include a locking unit connected to the housing. The locking unit includes a lock pinion configured to be rotated on a second axis that is perpendicular to the first axis. The key pinion is configured to rotate in response to a rotation of the locking unit using the key. The key pinion can be configured to cause a key ring to rotate about the first axis. The key ring can be configured to cause the locking plate to rotate to a locked or unlocked position, depending on the direction in which the key is turned. The system includes a lock plate configured to be received in the housing between the first surface and the second surface. The lock plate is configured to receive a finger of the motor ring such that it will be driven to rotate on the first axis in response to the rotation of the motor ring. The lock plate can also receive a finger of the key ring such that it will be driven to rotate on the first axis in response to the rotation of a key in the locking unit. The lock plate can comprise a slot such that the motion of the lock plate in response to either the motor ring or the key ring will not cause interference with the opposite ring. The system also includes a rear housing configured to be engaged with the lock plate through a mounting plate, and the rear housing is configured to receive the tablet computer.

The mount can further comprise a circuit board with a microcontroller which is configured to control the motor and to communicate with the tablet computer. The tablet computer can be configured with a software application that can communicate with the microcontroller on the mount. The software application can further be designed to receive as input an access credential which may, for example consist of one or more passwords, PINs (personal identification number), biometric information items (such as fingerprints) and/or images (such as barcodes, QR codes, or other images). The software application can be designed to authenticate the access credential (or credentials), and if valid, communicate with the microprocessor in the attached mount to operate (either lock or unlock) the motorized locking mechanism in that mount.

One or more tablets operating a software application which communicates with one or more mounts (to which each tablet is docked) can communicate electronically with a network-based database and administration software. The administration software can be configured to collect system data in the database. The database information can be indexed by timestamp and unique mount ID number. The information can include data relating to the mount, including availability of mains power, lock/unlock status, mount ID, head present status, as well as other data which may be available. The information can also include data relating to the tablet, including apps in operation, app-specific data, tablet ID, charging status and battery charge level, as well as other data which may be available. The information can also include data related to password authentication, including usernames, passwords, encryption keys, as well as other data which may be available. All information may be transmitted in either plain text or encrypted format, or a combination of formats. The administration software can be configured to gather and analyze collected data for the purpose of monitoring and maintaining the network of installed kiosks and to administer associated user accounts at the network level.

In some aspects, a microcontroller is configured to control operation of a system for mounting a tablet computer described here. A software application can request status information from the microcontroller in response to request that the microcontroller communicate information including one or more of the presence or absence of mains power, the status of the locking ring (locked or unlocked), or the serial number (or other unique identifier) of the system.

In some aspects, a networked system comprises multiple mounting systems such as those described here networked together and further connected to a networked computer system on which operates a central database and system administration software. The system administration software collects operating data from the network of mounting systems including one or more of the presence or absence of mains power, or a status of the locking ring. The software is further configured to index the collected status information by a serial number or other unique identifier of each specific mounting system. The networked system is further configured to collect data from a software application on a mounted tablet. The collected data is associated by the software application with the serial number or other unique identifier of the mounting system to which the tablet is docked. The software is further configured to subsequently transmit the collected data to the central database. The collected data includes one or more of mount information, access permission and information, or tablet information, including battery charge level, active application, or application data, as well as other data may be of interest for network monitoring or other reasons. The transmitted data is encrypted for security.

Details of one or more implementations of the subject matter described in this specification are set forth in the accompanying drawings and the description below. Other features, aspects, and potential advantages will become apparent from the description, the drawings, and the claims.

BRIEF DESCRIPTION OF THE DRAWINGS

FIG. 3 an example docking mount housing assembly in exploded view.

FIG. 6 illustrates an example motorized locking mount assembly in exploded view.

FIG. 7 illustrates an example network topology for motorized locking mounts.

FIG. 8 diagrams the locking and unlocking sequences of an example motorized locking mechanism.

FIG. 9 illustrates an example detailed view of an example motorized locking mechanism in the unlocked neutral position.

FIG. 10 illustrates an example detailed view of an example motorized locking mechanism in the locked neutral position.

FIG. 11 illustrates an example detailed view of an example motorized locking mechanism in the motor lock position.

FIG. 12 illustrates an example detailed view of an example motorized locking mechanism in the key lock position.

FIG. 13 illustrates an example detailed view of an example motorized locking mechanism in the key unlock position.

FIG. 14 illustrates an example detailed view of an example motorized locking mechanism in the motor unlock position.

Like reference numbers and designations in the various drawings indicate like elements.

DETAILED DESCRIPTION

Figure 1:
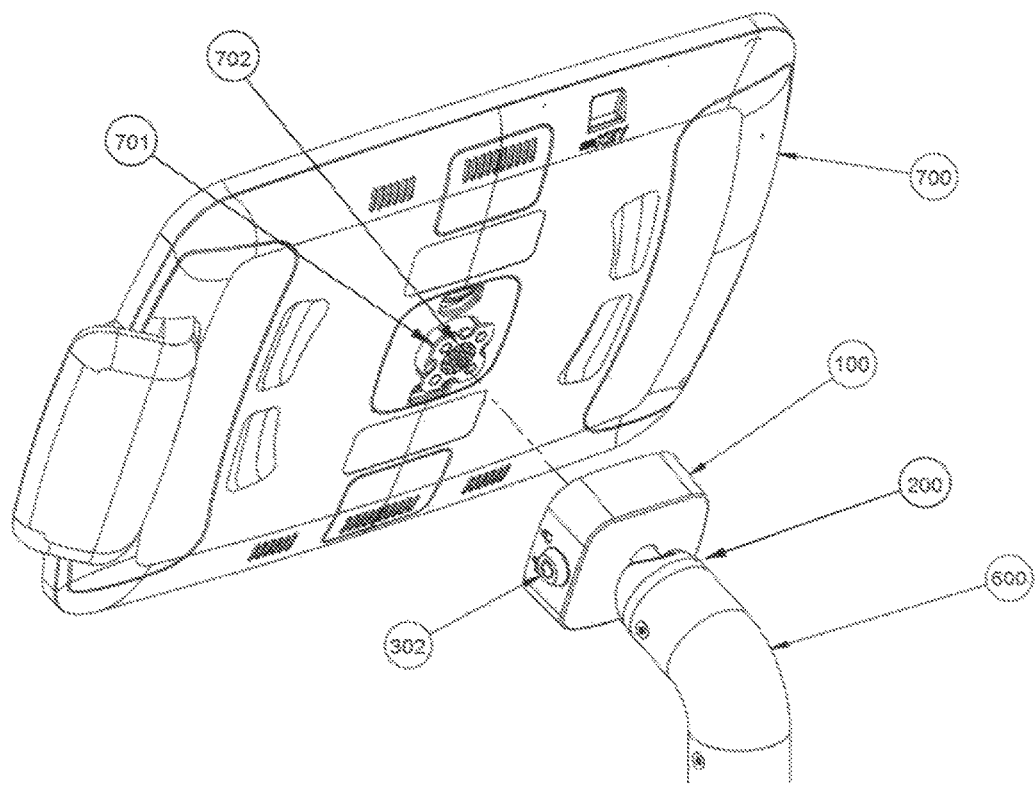
FIG. 1 illustrates an example docking apparatus.

This disclosure relates to a docking mechanism and apparatus, and specifically to a docking mount suited for use in supporting electronic equipment, for example, a tablet computer or other device. The docking apparatus described herein includes a docking mount and a mounting post for mounting the electronic equipment. In some implementations, the docking mount includes a lock plate. The lock plate can be driven by a mechanism. The mechanism can involve both motorized and manually driven components. The manually driven component of the mechanism can be driven by a key ring and key pinion attached to the mandrel of a locking unit, such as a standard tubular lock. The motorized component of the mechanism can be driven by a motor ring and motor pinion attached to the output shaft of a motor, with or without gearbox reduction, which motor is in turn controlled by a microcontroller. The mechanism can be a planar rotating mechanism which includes overlapping rings. The rings can be driven by the motor pinion and the key pinion respectively. The rings can be designed so that the movement of each ring does not interfere with the other. As it rotates, the lock plate captures the corners of a mounting plate located on the back of the electronic equipment being docked, thus securing the equipment to the docking mount. The docking mount further comprises a housing to house the lock plate, motor, locking unit, mechanism, and associated electronics. The planar nature of the docking mechanism allows the docking mount to be compact, while cleanly enclosing all moving parts.

Some electronic equipment, for example a tablet computer, does not have adequate onboard battery life to stay powered for a full day of use. A powered docking interface can address this need by supplying mains power to the docked electronic equipment. Furthermore, it can be beneficial to pass data, such as through a Universal Serial Bus ("USB") connection, to the electronic equipment to facilitate the operation of peripheral equipment that may be connected to the electronic equipment. The subject docking apparatus facilitates transmission of both power and data from the docking mount to the electronic equipment. This transmission of power and data is unaffected by the relative orientation of the docking mount and the docked electronic equipment. The docked equipment may be mounted to the docking mount in any of four primary orientations (portrait, landscape, inverted portrait, and inverted landscape), and the docking mount itself mounted at any angle or orientation, without negative impact to the function of the electrical connections.

The docking apparatus produces a mounting interface that includes a tight mechanical connection between the docked equipment and the docking mount. This tight mechanical connection is facilitated by an arrangement of progressively tighter lead-ins and alignment details. The mounting interface that results is beneficial both for ensuring good electrical contact and allowing mechanical forces to be transmitted through the mounting interface without looseness or wobbling. The arrangement of lead-ins and alignment details, in combination with the locking plate, are suited to transmit mechanical forces created by manipulation of the docked equipment across the mounting interface. In some implementations, manipulation of the docked equipment includes pivoting and rotating the equipment.

In some implementations, the docking assembly includes magnets at the mounting interface fixed to the housing. The magnets attract the mounting plate fixed to the electronic equipment into tight alignment with the docking mount and support at least a portion of the weight of the equipment. In some implementations, the user can leave the tablet on the mount without concern that the mounting plate will disengage with the docking mount, which allows the user to use both hands (if needed) to operate the lock. In some implementations, electrical connections between the docking mount and the electronic equipment function as the magnets retain the equipment in the docking mount, regardless of whether the mount is locked or not.

In some implementations, the mounting plate, pinion, locking unit, and lock plate are of metal material, and the housing is of plastic, facilitating an optimal balance of mechanical strength and economic manufacture. In other implementations, the mounting plate, pinion, locking unit, lock plate, housing, and other elements of the docking mount are of a different material or materials. In certain implementations, the elements of the docking apparatus are made with associated manufacturing methods, including die casting, injection molding, and stamping from aluminum, zinc, steel, plastics, composite materials, and glass/fiber reinforced plastics.

Certain implementations of the docking apparatus can provide one or more of the following potential advantages. The docking apparatus can allow the docked electronic equipment to be secured to and removed from the docking mount by use of a standard tubular key. The docking apparatus can also incorporate a motor, which can be configured to automatically secure the docked electronic equipment to the docking mount when the mounting interface is engaged with the docking apparatus. The motorized aspect of the docking apparatus can be configured to release the electronic equipment from the docking mount by use of an electronic signal. The release signal can consist of a transmission from the docked electronic equipment, such as a tablet computer. The transmission of a release signal may be initiated by the authentication of an access credential through a user interface provided on the tablet computer or other electronic equipment.

The motorized aspect of the system can include a motor disposed on a second axis parallel to, and offset from, the first (central) axis about which the lock place rotates. The motor can include an output shaft which lies along the second axis, and to which a motor pinion is mounted. The pinion can be configured to cause a motor ring to rotate about the first axis. The motor ring can be configured to cause the locking plate to rotate in to a locked or unlocked position, depending on the direction in which the motor is driven. The system may also include a key-operated locking unit connected to the housing. The locking unit includes a lock pinion configured to be rotated on a second axis that is perpendicular to the first axis. The key pinion is configured to rotate in response to a rotation of the locking unit using the key. The key pinion can be configured to cause a key ring to rotate about the first axis. The key ring can be configured to cause the locking plate to rotate to a locked or unlocked position, depending on the direction in which the key is turned. The system includes a lock plate configured to be received in the housing between the first surface and the second surface. The lock plate is configured to receive a finger of the motor ring such that it will be driven to rotate about the first axis in response to the rotation of the motor ring. The lock plate can also receive a finger of the key ring such that it will be driven to rotate about the first axis in response to the rotation of a key in the locking unit. The lock plate can comprise a slot such that the motion of the lock plate in response to either the motor ring or the key ring will not cause interference with the opposite ring. The system also includes a rear housing configured with an attached mounting plate, which mounting plate is captured by the lock plate when the docking apparatus is locked, and which mounting plate is released by the lock plate when the docking apparatus is unlocked. The rear housing can be a portion of a case which is configured to receive a tablet computer. The rear housing can be a portion of an electronic device housing directly.

The mount can further comprise a circuit board with a microcontroller which is configured to control the motor and to communicate with the tablet computer. The tablet computer can be configured with a software application that can communicate with the microcontroller on the mount. The software application can further be designed to receive as input an access credential which may, for example consist of one or more passwords, PINs (personal identification number), biometric information items (such as fingerprints) and/or images (such as barcodes, QR codes, or other images). The software application can be designed to authenticate the access credential (or credentials), and if valid, communicate with the microprocessor in the attached mount to operate (either lock or unlock) the motorized locking mechanism in that mount.

One or more tablets operating a software application which communicates with one or more mounts (to which each tablet is docked) can communicate electronically with a network-based database and administration software. The administration software can be configured to collect system data in the database. The database information can be indexed by timestamp and unique mount ID number. The information can include data relating to the mount, including availability of mains power, lock/unlock status, mount ID, head present status, as well as other data which may be available. The information can also include data relating to the tablet, including apps in operation, app-specific data, tablet ID, charging status and battery charge level, as well as other data which may be available. The information can also include data related to password authentication, including usernames, passwords, encryption keys, as well as other data which may be available. All information may be transmitted in either plain text or encrypted format, or a combination of formats. The administration software can be configured to gather and analyze collected data for the purpose of monitoring and maintaining the network of installed kiosks and to administer associated user accounts at the network level.

In its various embodiments, the subject docking apparatus yields a load-bearing, secure, detachable mount with the ability to provide power and data connection to the electronic device. In all embodiments disclosed, the docking apparatus includes an arrangement of lead-ins, guide features, electrical connections, and locking plate, and allows the alternate and non-conflicting use of both a standard key lock and an electronic signal transmitted from the electronic device (i.e. a tablet computer) to operate the docking apparatus.

The electrical connections are capable of providing power and data connection (for example USB) in any of four primary orientations (portrait, landscape, inverted portrait, and inverted landscape).

The combination of generally square geometry of the mounting interface and patterned contact pads in the electrical connection is especially suited to the mounting of electronic equipment, for example, tablet computers, because it allows the electronic equipment to be docked in one of four orientations, e.g., at 90-degree increments. For example, because tablet computers generally feature a self-orienting display, this flexibility in docking orientation allows the positioning of the tablet's camera and other features of the enclosure in any desired orientation without compromising the user interface.

The docking apparatus can allow power and signals (data) to be passed through the mounting interface. The docking apparatus can allow the docked electronic equipment to be mounted in any orientation, for example, portrait, landscape, standard, inverted, and/or other. The mounting interface can facilitate manipulation of the electronic equipment without looseness or wobbling, and provide physical security to the electronic equipment. The docking apparatus can use a magnetic attachment scheme with the magnets to conveniently support the electronic equipment whether the docking mount is locked or not. The docking apparatus can feature a static (non-moving) electrical interface, which is more reliable and durable than a wiping interface. The docking apparatus can be designed to be cost-effectively mass produced.

FIG. 1 illustrates an example docking apparatus 800. The example docking apparatus 800 allows an enclosure housing 700 comprising the docked electronic equipment to removably mount to a mounting post 600 via the docking mount 100. In some implementations, the docking mount 100 is fixedly secured to a surface, for example a floor or wall, or is supported by a base, for example, a weighted base. In some implementations, the docking mount 100 includes a pole extending from a side of the docking mount for ergonomic positioning. In other implementations, the docking mount 100 does not include the pole. In some implementations, the docking mount 100 is disposed at the end of the mounting post 600. The mounting post 600 supports the docking mount 100 at a specific height, securing the docking apparatus 700 from theft, and delivering power and/or data via an electrical connection, or cable, to an electrical interface in the docking mount 100. When the enclosure housing 700 is mated with the docking mount 100, an electrical connection is made between the electrical interface in the docking mount 100 and an electrical interface 702 disposed within the mounting flange 701. In some implementations, the mounting flange 701 may comprise a plate bonded or otherwise mounted to a surface of the docked electronic equipment. In some implementations, the mounting flange 701 can be incorporated directly into the housing of the docked electronic equipment. The enclosure housing 700 includes one or more features, such as mounting flange 701, that mate with the docking mount 100. The mounting post 600 may consist of a tubular post with a circular cross-section as shown. In other implementations, the mounting post 600 is of a different suitable structure, with a different cross-section, or both. In some implementations, the docking mount 100 fixedly mounts to the mounting post 600, or pivotally mounts with an interposed pivot joint 200. The enclosure housing 700 may be locked to the docking mount 100 by the locking unit 302, for example, with a key lock. The enclosure housing 700 may also be locked to the docking mount 100 by a motorized locking mechanism. The motorized locking mechanism may be used in combination with the key lock, and the mechanism can be designed such that the action of the motor and the key do not conflict. The motorized locking mechanism may be designed to lock the docking mount 100 automatically when the enclosure housing 700 is mated to it. The motorized locking mechanism may be designed to lock or unlock when it receives an electrical signal. The electrical signal to operate the motorized locking mechanism may be generated by a software program operating on electronic equipment inside the enclosure housing 700, for example a tablet computer. The software program may be designed to receive input of a password or access code to trigger operation of the motorized locking mechanism. The software program may be designed to recognize an image, such as a barcode, QR code, or other image, to trigger operation of the motorized locking mechanism. The software program may be designed to recognize a radio signal to trigger operation of the motorized locking mechanism.

Figure 2:
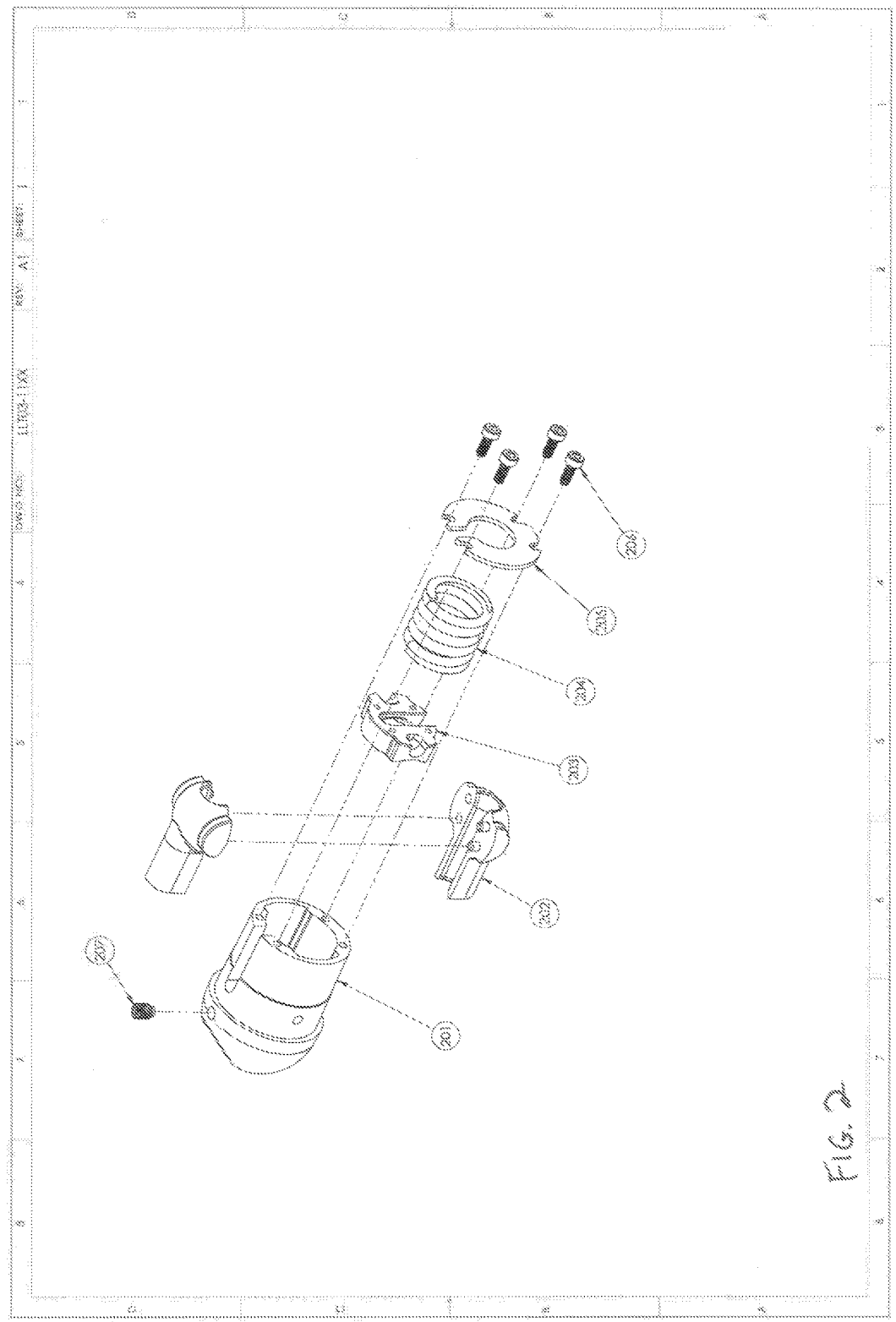
FIG. 2 illustrates an exploded view of an example pivoting neck assembly in exploded view.

FIG. 2 illustrates an exploded view of an example pivoting neck assembly 200. The docking mount 100 may optionally include example pivoting neck assembly 200 of FIG. 2. The pivoting neck assembly 200 includes a socket 201. A two-part ball 202 is assembled around one or more cables, for example cable 101, and installed into socket 201. Cup 203 is placed into socket 201 behind two-part ball 202. Spring 204 is placed into the assembly behind cup 203 and held in compression by spring plate 205 and screws 206. The force generated by the compressed spring creates stiffness in the pivoting neck assembly 200, allowing it to support the weight of items mounted to it, for example enclosure housing 700 and any associated equipment. Set screw 207 can be screwed into socket 201 and tightened against two-part ball 202 to stiffen or lock completely the movement of the pivoting neck assembly 200. The two-part ball 202 may be greased for smooth operation and reduced wear over time. The use of a two-part ball allows the assembly to be compact and still pass complete cables, which may include larger overmolded connectors. The size of cable overmolds which is usable with this configuration is limited only by the size of the mouth of socket 201.

FIG. 3 illustrates an exploded view of an example docking mount housing assembly 300. The docking mount 100 includes the example docking mount housing assembly 300 of FIG. 3. The docking mount housing assembly 300 includes a housing 301 and a locking unit 302 disposed on a side surface of the housing 301. The housing 301 has a front surface, a back surface separated from the front surface along a first axis, and a side surface that connects the front surface and the back surface. In some implementations, the front surface is parallel to the back surface, and the side surface is perpendicular to the front surface. The locking unit 302 includes a lock mandrel and a key lock disposed in a hole in the housing 301. In some implementations, an anti-rotation plate 303 is disposed over the locking unit 302 and secured with a lock mounting nut 304. A screw 306 secures the lock pinion 305 to the lock mandrel. The pinion 305 rotates in response to a rotation of the locking unit 302 using a corresponding key. Detent 307 can be installed into housing 301. Detent 307 can act to retain lock ring 111 in its position unless sufficient force, such as might be generated by the motor or turning of a key in the locking unit, acts to move the lock ring 111.

Figure 4:
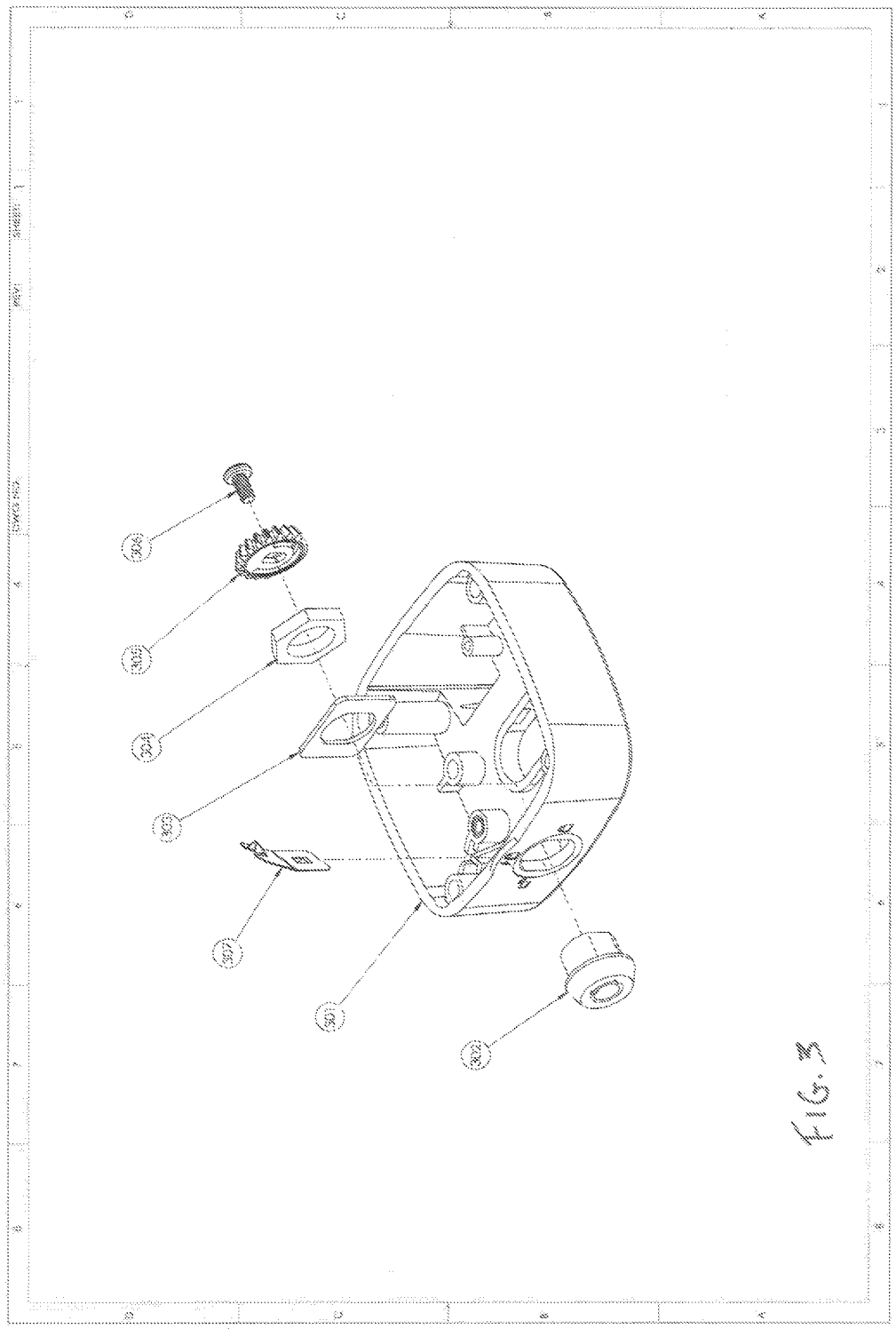
FIG. 4 an example magnet housing assembly in exploded view.
Figure 4:
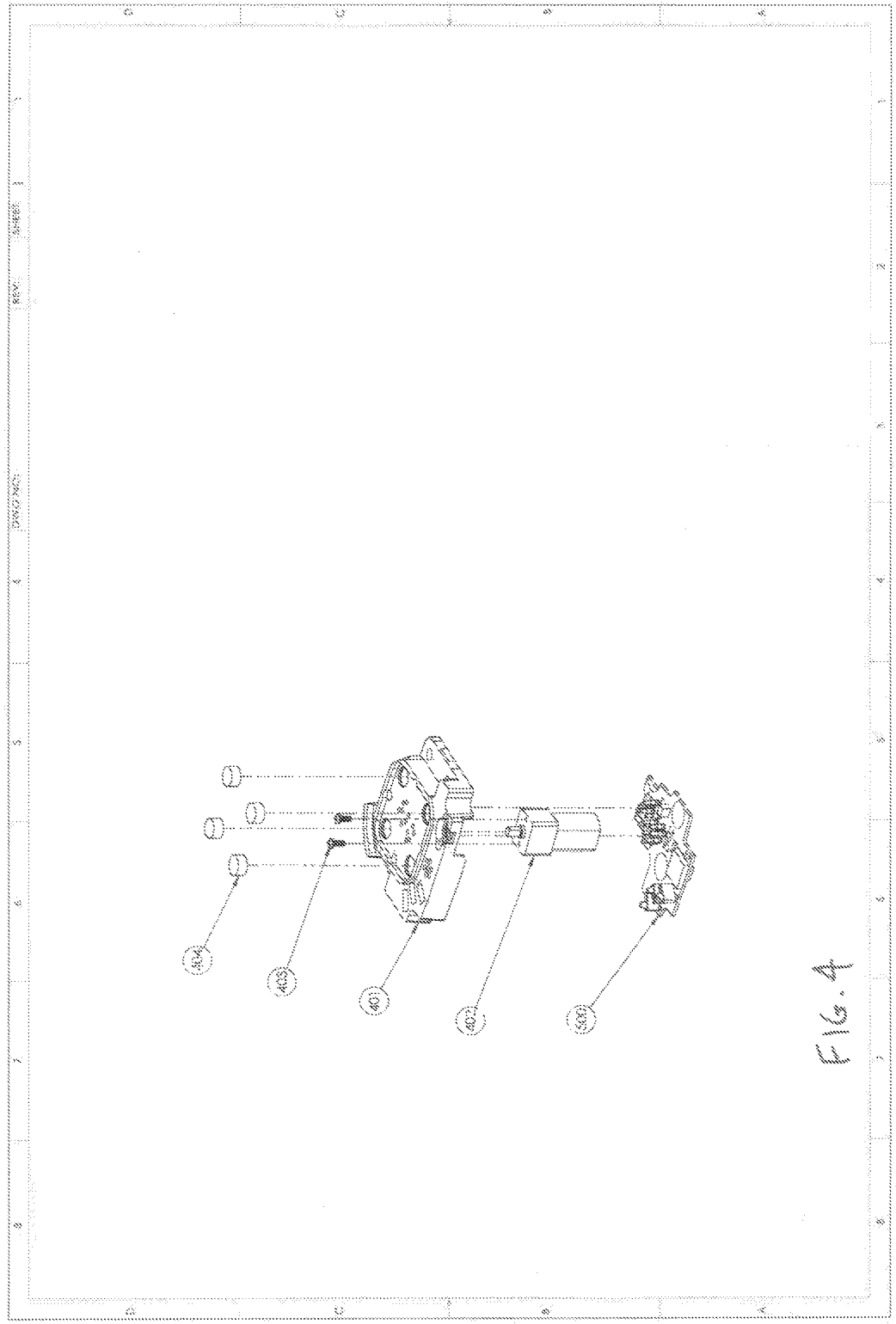

FIG. 4 illustrates an exploded view of an example magnet housing assembly 400. The docking mount 100 includes the example magnet housing assembly 400 of FIG. 4. The magnet housing assembly 400 comprises a magnet housing 401 (which serves as an internal frame) to which a motor 402 is installed with screws 403. A circuit board assembly 500, mounts into magnet housing 401 with, for example, heat stakes. The circuit board assembly 500 is electrically connected to cable 206 (see FIG. 5). The magnet housing 401 also receives four magnets 404. In some implementations, the number of magnets 404 can be different. The magnets can be installed using a variety of methods, including bonding and press-fitting.

Figure 5:
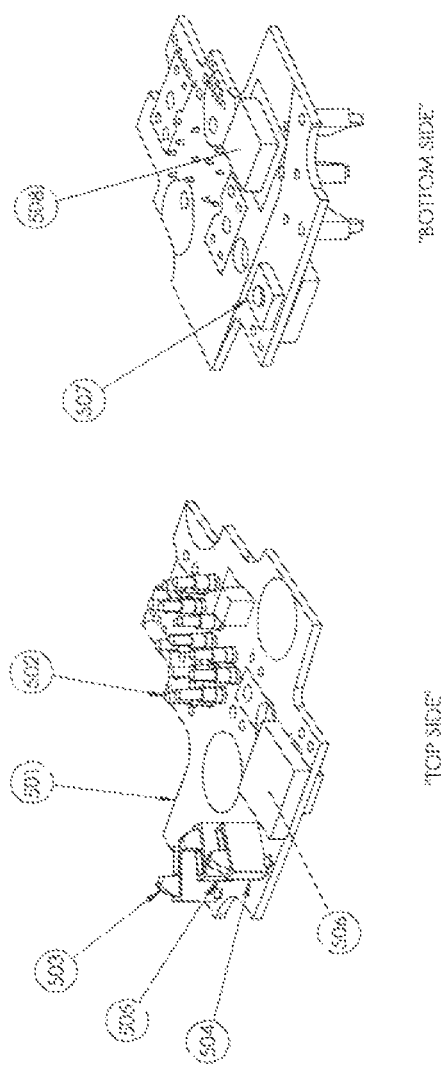
FIG. 5 illustrates a view of an example printed circuit board (PCB) assembly.

FIG. 5 illustrates a view of an example printed circuit board (PCB) assembly 500, as would be used with the motorized locking mechanism. The docking mount 100 includes the example PCB assembly 500 of FIG. 5. The PCB assembly 500 is used to electronically operate the motorized locking mechanism and comprises several electronic components which may be utilized for that function. The printed circuit board 501 incorporates the necessary circuitry to electrically connect and mechanically support the electronic components. The PCB assembly 500 can include one or more spring pins 502 which, when enclosure housing 700 is mated with to docking mount 100, connect to the electrical interface 702. Spring pins 502 can be used to transmit power and/or data to the electronic equipment within enclosure housing 700. Lock limit switch 503 can be used to determine whether the lock ring 110 is rotated to the locked position, thus capturing and retaining the corners of mounting flange 701 within the central opening in lock ring 110. Unlock limit switch 504 can be used to determine whether the lock ring 110 is rotated to the unlocked position, thus allowing mounting flange 701 to be inserted or removed from within the central opening in lock ring 110. Motor ring neutral limit switch 505 can be used to determine whether the motor ring 109 is rotated to the neutral position, thus allowing the key ring 108 to freely move the lock ring 110 to either the locked or unlocked position. Piezo speaker 506 can be used to provide alerts to the user including alarms and mode setting feedback. Switch 507 can be used to allow the user to interact with the device electronics, such as to set a variable operating mode. Switch 507 can be positioned in the enclosure so that it can be accessed with a paperclip or other tool. Microcontroller 508 can be used to monitor and interpret signals from the limit switches 503, 504, and 505 and mode switch 507, and operate the motor 302 and piezo speaker 506 accordingly. The motor 402 can be electrically attached to the circuit board with wires, such as at thru-hole solder points 5A. Microcontroller 508, with supporting circuitry and firmware, can be used to monitor the current flowing through motor 302, detect when the motor is being overloaded, and alert the user accordingly. Microcontroller 508, with supporting circuitry and firmware, can communicate with the electronic equipment inside the enclosure housing 700, for example a tablet computer. The electronic equipment inside the enclosure housing 700, for example a tablet computer, can run a software program designed to receive and authenticate access credentials which, if valid, can communicate with the microcontroller 508 to operate (either lock or unlock) the motorized locking mechanism. The information communicated between electronic equipment inside enclosure housing 700 and microcontroller 508 can be encrypted for security.

FIG. 6 illustrates an exploded view of an example motorized locking mount assembly 100. The motorized locking mount assembly 100 is assembled by routing cable 101 through optional pivoting neck assembly 200, through docking mount housing assembly 300, through neck plate 102, through internal dock plate 103, and attaching it electrically to the provided terminals on printed circuit board 501. The neck plate 102 and internal dock plate 103 are disposed between a front surface and a back surface of the housing 301. The pivoting neck assembly 200, docking mount housing assembly 300, neck plate 102, and internal dock plate 103 include passages to receive the cable 101. The cable 101 can transmit power and/or signals to electronic equipment. The internal dock plate 103 attaches with screws 104 to ball halves 202. The ball halves 202 can be part of a pivoting neck assembly 200. Additionally, internal dock plate 103 can attach to docking mount housing 301 with screw 105. A circuit board 501 at the end of cable 101 mounts into a magnet housing 401 with, for example, heat stakes, as part of magnet housing assembly 400. The magnet housing assembly 400 secures to docking mount housing 301 (part of docking mount housing assembly 300) with, for example, three additional screws 107. The three additional screws 107 pass through magnet housing 401 (part of magnet housing assembly 400), internal dock plate 103, and into docking mount housing 301 (part of docking mount assembly 300), capturing neck plate 102 in the process. A motor pinion 106, used to drive motor ring 109, is mounted to the output shaft of gear motor 402, for example by press-fit. Key ring 108 and motor ring 109 are lubricated, with grease for example, and seated into a receiving groove in lock plate 110. The lock plate 110, key ring 109, and motor ring 109 are placed into the assembly with gear teeth on the key ring 108 meshing with gear teeth on the key pinion 305 and the gear teeth on the motor ring 109 meshing with gear teeth on the motor pinion 106. The front surface of the motorized locking mount assembly 100, for example, a mount cover 111, is placed over the lock plate 110 and secured, for example, with four screws 112. Components of the motorized docking mount assembly 100 may be assembled in an order different from that described above. In some implementations, different fasteners may be used.

FIG. 7 illustrates an example network topology in which a motorized locking mount may reside. An example network topology may include three layers. A first layer of the example network topology can be the equipment layer 901, consisting of one or more mounts 904, 914, 924, with firmware 905, 915, 925 residing on microcontrollers, such as example microcontroller 508, in each of those mounts. The firmware on these various mounts may be the same or may be different. The firmware may be specialized, for example to support and communicate with different device models 907, 917, 927. The mounts 904, 914, 924 may be the same or different, for example to support and transmit different levels of recharge voltage and power as may be required by different device models 907, 917, 927. A second layer of the example network topology can be the device layer 902, consisting of one or more devices 907, 917, 927, with software application 906, 916, 926 operating on those devices 907, 917, 927. The devices 907, 917, 927 may, for example, be tablet computers. The devices 907, 917, 927 may be the same or different, such as different models of tablet computer. The software application 906, 916, 926 may be the same or different, such as different versions of the software application 906, 916, 926 designed to operate on different models of tablet computer. A third layer of the example network topology can be the network layer 903, consisting of a database application 908 operating on a networked computer 909. The networked computer 909 is connected to the devices 907, 917, 927 by a network, such as the Internet, and communicates with those devices 907, 917, 927 over either wireless or wired networks, or a combination of wireless and wired networks. One aspect of the software application 906, 916, 926 can be that it is compatible, for the device 907, 917, 927 on which it resides, to communicate with the database application 908 on the networked computer 909. This allows the database application 908 on the networked computer 909 to administer and collect information from a large installed network of devices 907, 917, 927 and mounts 904, 914, 924 to a single, central location, independent of the specific device, for example model of tablet computer, which may be installed. The connection of multiple mounts 904, 914, 924 using a network allows those mounts to be centrally administered. Some examples of network-supported activities may include logging of access data, such as when the mount was locked or unlocked and by which user, whether a device 907, 917, 927 is docked in a mount, and if so which physical mount (and therefore geographic location, if that location is registered to the mount) it is docked in, and whether the device is receiving power from that mount. Additional examples of network-supported activities may include the provisioning of user accounts and management of passwords for those accounts, the remote activation of a motorized docking mount 904, 914, 924, and the updating of software 906, 916, 926 and firmware 905, 915, 925.

A software application 906, 916, 926 may also communicate information to the networked computer 909 that may be useful in the monitoring of the devices 907, 917, 927 themselves, independent of the mounts 904, 914, 924. Such information may include what other software applications are running and the charge level of the device batteries. A software application 906, 916, 926 may also communicate information to the networked computer 909 that may be useful in the monitoring of the environment in which devices 907, 917, 927 are deployed, such as whether a person is standing in front of the device, whether that person is looking at the device, whether that person is using the device, and how often people stand in front of, look at, and use the device over a period of time.

The software application 906, 916, 926 can be designed to receive as input an access credential which may, for example consist of one or more passwords, PINs (personal identification number), biometric information items (such as fingerprints) and/or images (such as barcodes, QR codes, or other images). The software application can be designed to authenticate the access credential (or credentials), and if valid, communicate with the microprocessor 508 in the attached mount 904, 914, 924 to operate (either lock or unlock) the motorized locking mechanism in that mount 904, 914, 924. Such barcode, QR code, or other image may be printed on a piece of paper or other object or may be displayed digitally, such as on the screen of a tablet or cell phone. The software application 906, 916, 926 can be designed to recognize a radio signal to trigger operation of the motorized locking mechanism. The software application 906, 916, 926 can be designed to recognize a command from a networked computer 909 to trigger operation of the motorized locking mechanism.

An administration interface can be provided as part of the database application 908 operating on networked computer 909 that allows the collected data and administrative functions to be accessed from any other computer or device also connected to that network, including devices 907, 917, 927.

FIG. 8 diagrams the locking and unlocking sequences of an example motorized locking mechanism. An important and advantageous aspect of the mechanism is that either the motor or the key may be used to both lock and unlock the mechanism. This allows the mechanism to be controlled by software (via the motor) or overridden manually using a key. A manual override for the mechanism allows it to be used in scenarios where power is not available or where a less technological solution is desired. In order to allow two means of actuation for the same mechanism, the example motorized locking mechanism employs a neutral state for each method of actuation. In the example motorized locking mechanism, either the motor ring 109 or key ring 108 can be driven to move the lock ring 110 between the locked and unlocked positions. When either the motor ring 109 or key ring 108 is in its neutral position (centered between lock and unlock), an annular slot in the lock ring allows the lock ring to move past the stationary ring (motor ring 109 or key ring 108) while the other ring (key ring 108 or motor ring 109) is driven to actuate the mechanism. If the annular slot were not present, or if the rings did not start each operation in their neutral (centered) position, the motor ring 109 and key ring 108 would be interlocked, and would interfere with each other's movement in the mechanism. While the manual force of a key being turned in the locking unit 302 is able to overcome the motor 402 (and this is useful for scenarios where power fails or the motor ring 109 jams) the motor 402 would not be able to overcome the locking unit 302, as the locking unit 302 can only be turned with a key.

The diagram in FIG. 8 shows the sequence of movements which the mechanism employs to move between unlocked and locked positions. So that the two methods of driving the mechanism (motor and key) do not interfere with each other, each sequence begins and ends in a neutral position, with both rings (key ring 108 and motor ring 109) centered. In the diagram, locking operations move from left to right and unlocking operations move from right to left.

From the "unlocked neutral position" (FIG. 9), the mechanism can be locked with either the motor 402 or key-driven locking unit 302. If the mechanism is locked by the motor 402, the motor pinion 106 is driven in a clockwise direction, driving the motor ring 109 in a counter-clockwise direction, which pushes against the lock ring 110 to rotate the lock ring 110 into the locked position, as shown in FIG. 11. When the lock ring 110 reaches the locked position (signaled by a limit switch), the motor pinion 106 is then driven in a counter-clockwise direction, returning the motor ring 109 to its neutral position. When the motor ring 109 reaches its neutral position (signaled by a limit switch) the motor is stopped. The mechanism is now in the "locked neutral position", as shown in FIG. 10.

If the mechanism is locked using a key in the locking unit 302, the user inserts a key and turns it clockwise to the locked position. This turns pinion 305 in a clockwise direction, which drives the key ring 108 in a counter-clockwise direction, which pushes against the lock ring 110 to rotate the lock ring into the locked position, as shown in FIG. 12. When the lock ring 110 reaches the locked position, a stop on the key pinion prevents the user from turning the key further. To enable motor-driven unlocking, the user then turns the key counter-clockwise to the center position. This turns pinion 305 in a counter-clockwise direction, which drives the key ring 108 in a clockwise direction, which returns the key ring 108 to its neutral position. A slot in the keyway of locking unit 302 only allows the key to be removed when it is rotated to the center position, ensuring that the key ring 109 is in its neutral position when the key is removed. When the key aligns with the slot in the locking unit 302, the key ring 109 will be in its neutral position and the key can be removed. The mechanism is now in the "locked neutral position", as shown in FIG. 10.

From the "locked neutral position" (FIG. 10), the mechanism can be unlocked with either the motor 402 or key-driven locking unit 302. If the mechanism is unlocked by the motor 402, the motor pinion 106 is driven in a counter-clockwise direction, driving the motor ring 109 in a clockwise direction, which pushes against the lock ring 110 to rotate it into the unlocked position, as shown in FIG. 13. When the lock ring 110 reaches the unlocked position (signaled by a limit switch), the motor pinion 106 is then driven in a clockwise direction, returning the motor ring 109 to its neutral position. When the motor ring 109 reaches its neutral position (signaled by a limit switch) the motor is stopped. The mechanism is now in the "unlocked neutral position", as shown in FIG. 9.

If the mechanism is unlocked using a key in the locking unit 302, the user inserts a key and turns it counter-clockwise to the unlocked position. This turns pinion 305 in a counter-clockwise direction, which drives the key ring 108 in a clockwise direction, which pushes against the lock ring 110 to rotate it into the unlocked position, as shown in FIG. 14. When the lock ring 110 reaches the unlocked position, a stop on the key pinion prevents the user from turning the key further. To enable motor-driven locking, the user then turns the key clockwise to the center position. This turns pinion 305 in a clockwise direction, which drives the key ring 108 in a counter-clockwise direction, which returns the key ring 108 to its neutral position. A slot in the keyway of locking unit 302 only allows the key to be removed when it is rotated to the center position, ensuring that the key ring 109 is in its neutral position when the key is removed. When the key aligns with the slot in the locking unit 302, the key ring 109 will be in its neutral position and the key can be removed. The mechanism is now in the "unlocked neutral state", as shown in FIG. 14.

FIG. 9 illustrates an example detailed view of an example motorized locking mechanism. The view in FIG. 9 shows the mechanism in the unlocked neutral position. When the locking mechanism is in this position the enclosure housing 700 can be freely removed from and mated to the docking mount 100. In FIG. 9, Motor ring 109 is shown in its centered (neutral) position, with limit switch 505 rising into pocket 5C in motor ring 109. The teeth of motor ring 109 are centered on motor pinion 106 at location 5A, and the teeth of key pinion 305 are centered on the meshing teeth of key ring 108 at location 5E. The key ring drive finger 5B and motor ring drive finger 5D are both against the left inside edge of the lock ring slot. In this configuration, the lock ring 110 is free to rotate in a counter-clockwise direction (to the locked position). The lock ring detent 307 holds the lock ring 110 in a static position by pressing into a groove at position 5F.

FIG. 10 illustrates an example detailed view of an example motorized locking mechanism. The view in FIG. 10 shows the mechanism in the locked neutral position. When the enclosure housing 700 is mated to the docking mount 100 and the locking mechanism is rotated to this position, the corners of the mounting plate 702 are captured to the docking mount 100 by the lock ring 110. The mounting plate 702 can be affixed to, or incorporated in, a surface of the enclosure housing 700, and thus the enclosure housing 700 is retained to the docking mount 100. The docking mount 100 can be optionally mounted to a pivot joint 200 and/or mounting post 600 and secured to a fixed surface, such as a heavy object, floor, counter, table, wall, pole, or other fixed surface or object. When the mounting plate 702 is captured by the lock ring 110, and thus the enclosure housing 700 captured to the docking mount 100, the enclosure housing 700 becomes physically secured to the surface or object to which the docking mount 100 (and alternately pivot joint 200 and mounting post 600) is secured to. In FIG. 10, Motor ring 109 is shown in its centered (neutral) position, with limit switch 505 rising into pocket 6C in motor ring 109. The teeth of motor ring 109 are centered on motor pinion 106 at location 6A, and the teeth of key pinion 305 are centered on the meshing teeth of key ring 108 at location 5E. The key ring drive finger 6B and motor ring drive finger 6D are both against the right inside edge of the lock ring slot. In this configuration, the lock ring 110 is free to rotate in a clockwise direction (to the unlocked position). The lock ring detent 307 holds the lock ring 110 in a static position by pressing into a groove at position 6F.

FIG. 11 illustrates an example detailed view of an example motorized locking mechanism. The view in FIG. 11 shows the mechanism in the position it arrives at when it has been locked by the motor 402. To reach this position, starting from the neutral unlocked position (FIG. 9) motor 402 turns motor pinion 106 in a clockwise direction. The teeth of motor pinion 106 mesh with the teeth of motor ring 109 at location 2A, driving motor ring 109 clockwise within its groove in lock ring 110. A finger extending from motor ring 109 pushes against lock ring 110 at location 2B. If lock ring 110 is in the unlocked position, the force of the finger of motor ring 109 pushing against lock ring 110 at location 2B will drive the lock ring 110 to the locked position, as shown in FIG. 11. As the motor ring 109 pushes the lock ring 110, the lock ring detent 307 moves over a series of detent grooves at location 2F. When the lock ring 110 reaches the locked position, feature 2C on the lock ring 110 acts to depress limit switch 503. The microcontroller 508 can detect the state change of limit switch 503 and stop the rotation of the motor 402. While the lock ring moves, key ring 108 is held stationary, as it is meshed at location 1E with stationary key pinion 305, attached to key lock 302. When the lock ring reaches the locked position, as shown in FIG. 11, the lock ring detent 307 holds it in place while the motor ring 109 returns to the neutral locked position (FIG. 10).

FIG. 12 illustrates an example detailed view of an example motorized locking mechanism. The view in FIG. 12 shows the mechanism in the position it arrives at when it has been locked by the locking unit 302. To reach this position, starting from the neutral unlocked position (FIG. 9) a key is inserted into locking unit 302 and turned clockwise. Locking unit 302 turns key pinion 305 in a clockwise direction. The teeth of key pinion 305 mesh with the teeth of key ring 108 at location 4E, driving key ring 108 counter-clockwise within its groove in lock ring 110. A finger extending from key ring 108 pushes against lock ring 110 at location 4B. If lock ring 110 starts in the unlocked position, the force of the finger of key ring 108 pushing against lock ring 110 at location 4B will drive the lock ring 110 counter-clockwise to the locked position, as shown in FIG. 12. As the key ring 108 pushes the lock ring 110, the lock ring detent 307 moves over a series of detent grooves at location 4F. When the lock ring 110 reaches the locked position, feature 4C on the lock ring 110 acts to depress limit switch 503. The microcontroller 508 can detect the state change of limit switch 503 and recognize that the lock ring is in the locked position. While the lock ring moves, motor ring 109 is held stationary, as it is meshed at location 4A with stationary motor pinion 106, attached to motor 402. If, for some reason, the motor ring 109 is not in its neutral position when the locking unit 302 is turned with a key, the motor gearing may be back-driven to allow the mechanism to be moved, even without power or control of the motor. When the lock ring reaches the locked position, as shown in FIG. 12, the lock ring detent 307 holds it in place while the key ring 109 is returned to the neutral position (FIG. 10). The locking unit 302 may incorporate a feature, such as a notch, which only allows the key to be removed when the locking unit 302 is in its neutral position.

FIG. 13 illustrates an example detailed view of an example motorized locking mechanism. The view in FIG. 13 shows the mechanism in the position it arrives at when it has been unlocked by the key. To reach this position, starting from the neutral locked position (FIG. 10) a key is inserted into locking unit 302 and turned counter-clockwise. Locking unit 302 turns key pinion 305 in a counter-clockwise direction. The teeth of key pinion 305 mesh with the teeth of key ring 108 at location 3E, driving key ring 108 counter-clockwise within its groove in lock ring 110. A finger extending from key ring 108 pushes against lock ring 110 at location 3B. If lock ring 110 starts in the locked position, the force of the finger of key ring 108 pushing against lock ring 110 at location 3B will drive the lock ring 110 clockwise to the unlocked position, as shown in FIG. 13. As the key ring 108 pushes the lock ring 110, the lock ring detent 307 moves over a series of detent grooves at location 3F. When the lock ring 110 reaches the unlocked position, feature 3C on the lock ring 110 acts to depress limit switch 504. The microcontroller 508 can detect the state change of limit switch 504 and recognize that the lock ring is in the unlocked position. While the lock ring moves, motor ring 109 is held stationary, as it is meshed at location 3A with stationary motor pinion 106, attached to motor 402. If, for some reason, the motor ring 109 is not in its neutral position when the locking unit 302 is turned with a key, the motor gearing may be back-driven to allow the mechanism to be moved, even without power or control of the motor. When the lock ring reaches the unlocked position, as shown in FIG. 13, the lock ring detent 307 holds it in place while the key ring 109 is returned to the neutral position (FIG. 9). The locking unit 302 may incorporate a feature, such as a notch, which only allows the key to be removed when the locking unit 302 is in its neutral position.

FIG. 14 illustrates an example detailed view of an example motorized locking mechanism. The view in FIG. 14 shows the mechanism in the position it arrives at when it has been unlocked by the motor. To reach this position, starting from the neutral locked position (FIG. 10) motor 402 turns motor pinion 106 in a counter-clockwise direction. The teeth of motor pinion 106 mesh with the teeth of motor ring 109 at location 1A, driving motor ring 109 clockwise within its groove in lock ring 110. A finger extending from motor ring 109 pushes against lock ring 110 at location 1B. If lock ring 110 starts in the locked position, the force of the finger of motor ring 109 pushing against lock ring 110 at location 1B will drive the lock ring 110 to the open position, as shown in FIG. 13. As the motor ring 109 pushes the lock ring 110, the lock ring detent 307 moves over a series of detent grooves at location 1F. When the lock ring 110 reaches the open position, feature 1C on the lock ring 110 acts to depress limit switch 504. The microcontroller 508 can detect the state change of limit switch 504 and stop the rotation of the motor 402. While the lock ring moves, key ring 108 is held stationary, as it is meshed at location 1E with stationary key pinion 305, attached to key lock 302. When the lock ring reaches the open position, as shown in FIG. 13, the lock ring detent 307 holds it in place while the motor ring 109 is returned to the neutral position (FIG. 9).

Other embodiments are within the scope of the following claims.

The invention claimed is:

1. An electromechanical mounting apparatus for mounting electronic equipment comprising:
    a housing comprising a front surface and a back surface separated from the front surface along a first axis;
    a motor disposed within the housing and mounted to an internal frame, the motor having an output shaft aligned parallel to the first axis;
    a motor pinion mounted to the output shaft of the motor, the motor pinion configured to rotate in response to when the motor is energized;
    a motor ring configured to rotate about the first axis in response to movement of the motor pinion;
    a lock plate configured to be received in the housing between the front surface and the back surface, the lock plate configured to rotate about the first axis in response to rotation of the motor ring, the lock plate configured to capture a mounting plate associated with the electronic equipment to be mounted; and
    a locking unit connected to the housing, the locking unit comprising a lock pinion configured to be rotated perpendicularly to the first axis to drive a key ring about the first axis in response to a rotation of the lock pinion.

2. The apparatus of claim 1, wherein the internal frame comprises a magnet housing.

3. The apparatus of claim 1 which further comprises:
    a locking unit disposed on a side surface of the housing that connects the front surface and back surface, the locking unit comprising a lock mandrel, the locking unit configured to be selectively rotated to either lock or unlock the mount;
    a key pinion mounted to the lock mandrel, the key pinion configured to be rotated about a second axis which is at an angle relative to the first axis, the key pinion configured to rotate in response to a rotation of the locking unit using a key inserted into the locking unit; and
    a key ring configured to rotate about the first axis in response to movement of the key pinion,
    wherein the lock plate is configured to rotate about the first axis in response to rotation of the key ring.

4. The apparatus of claim 1 configured to adopt neutral positions such that either the motorized mechanism for locking and unlocking the mount or the coexistent manual, keyed mechanism for locking and unlocking the mount do not interfere with each other.

5. The apparatus of claim 4, wherein the lock plate comprises a slot configured to allow the lock plate to move freely relative to one of the key ring and the motor ring that remains stationary when the other of the key ring and the motor ring is being driven to change the position of the lock plate.

6. The apparatus of claim 1 which further comprises a printed circuit board assembly comprising electronic components comprising a microcontroller configured to operate the motor in response to electronic signals.

7. The apparatus of claim 1, further comprising:
    an enclosure configured to receive electronic equipment;
    a mounting plate configured to be mounted to a rear-facing surface of the enclosure, said mounting plate configured to be securely captured when the lock plate is rotated into a locked position and released when the lock plate is rotated to an open position.

8. The apparatus of claim 7, further comprising:
a locking unit disposed on a side surface of the housing that connects the front surface and back surface, the locking unit comprising a lock mandrel, the locking unit configured to be selectively rotated to either lock or unlock the mount,
wherein the mounting plate is configured to adopt neutral positions such that either the motorized mechanism for locking and unlocking the mount or the coexistent manual, keyed mechanism for locking and unlocking the mount do not interfere with each other.

9. The apparatus of claim 7, wherein the electronic equipment is a tablet computer.

10. The apparatus of claim 1, wherein the housing further comprises lead-in geometry configured to orient and guide the mounting plate into the housing.

11. The apparatus of claim 1, wherein the housing further comprises a magnet configured to attract the mounting plate to the housing.

12. The apparatus of claim 1, wherein the housing further comprises electrical contacts to transfer electrical signals through a central hole in the lock plate to the electronic equipment.

13. The apparatus of claim 12, wherein the electrical contacts comprise a plurality of spring pins configured to mate with contact pads attached to the electronic equipment.

14. The apparatus of claim 1, wherein the housing comprises:
an internal dock plate configured to be disposed between the front surface and the back surface, wherein each of the housing and the internal dock plate includes a passage configured to receive a cable to transmit signals to electronic equipment; and
a magnet housing configured to receive a circuit board connected to an end of the cable.

15. The apparatus of claim 1, wherein the front surface is parallel to the back surface, and wherein side surface is perpendicular to the front surface.

16. A system for mounting a tablet computer, the system comprising:
a mounting post having a first end and a second end;
a housing comprising a first surface and a second surface separated from the first surface along a first axis, the housing configured to be attached to the first end of the mounting post;
a motor mounted within the housing, the motor having an output shaft comprising a motor pinion configured to be rotated about a second axis that is parallel to the first axis, the motor pinion configured to mesh with gear teeth and drive a motor ring about the first axis in response to a rotation of the motor pinion;
a lock plate configured to be received in the housing between the first surface and the second surface, the lock plate configured to rotate about the first axis in response to rotation of the motor pinion;
an enclosure configured to receive the tablet computer having a mounting plate, wherein when the tablet computer is received with the enclosure, rotation of the lock plate cause the lock plate to capture the mounting plate; and
a locking unit connected to the housing, the locking unit comprising a lock pinion configured to be rotated about a third axis that is perpendicular to the first axis, the lock pinion configured to drive a key ring about the first axis in response to a rotation of the lock pinion, and wherein the lock plate is configured to rotate about the first axis driven either by the motor and motor pinion or in response to the rotation of the lock pinion.

17. The system of claim 16 wherein the lock plate has a slot configured to facilitate a neutral position from which the lock plate can be rotated by either the motor or the key without one method of actuation interfering with the other.

18. The system of claim 16, further comprising a rear housing, wherein the mounting post, the housing, and the rear housing are configured to receive a cable configured to be connected to the tablet computer to transmit power signals or data signals to the tablet computer.

19. The system of claim 18, further comprising an electrical interface disposed between the housing and the rear housing, the electrical interface configured to transmit the power signals or the data signals received through the cable to the tablet computer.

20. The system of claim 16, further comprising a key configured to rotate the lock pinion, which in turn rotates the lock plate to securely affix the rear housing to, or release the rear housing from, the housing.

21. The system of claim 16, further comprising:
a locking ring configured to alternatively adopt a locked position or an unlocked position;
a printed circuit board assembly having electronic components including a microcontroller that operates the motor in response to electronic signals;
an electrical interface configured to transfer electrical signals to the electronic components; and
embedded software on the microcontroller configured to detect the presence of electrical signals at the electrical interface and, in response, to power the motor to drive the locking ring to a locked position, thereby capturing the mounting plate in an automated fashion.

22. The system of claim 16, further comprising:
a locking ring configured to alternatively adopt a locked position or an unlocked position;
a microcontroller configured to operate the motor in response to electronic signals;
embedded software on the microcontroller that, in response to a predetermined electrical signal, causes the microcontroller to power the motor to drive the locking ring to an unlocked position, thereby releasing the mounting plate.

23. The system of claim 16, further comprising a software application present on the tablet housed within the enclosure, wherein the software application configured to provide a user interface that facilitates entry by a user one or more of an access code, password, biometric reading, image, or other form of access credential, and which in response to receiving a verifiable access credential, generates an electrical signal that causes the mounting plate to be released.

24. The system of claim 23 in which the access credential is encrypted for security.

25. The system of claim 23 further comprising a microcontroller configured to control operation of the system, wherein the software application can request status information from the microcontroller in response to request the microcontroller communicate information including one or more of the presence or absence of mains power, the status of the locking ring (locked or unlocked), or the serial number (or other unique identifier) of the system.

* * * * *